US009001515B2

(12) United States Patent
Tang et al.

(10) Patent No.: US 9,001,515 B2
(45) Date of Patent: Apr. 7, 2015

(54) UNIVERSAL PULL TAB RELEASE FOR MODULES INCLUDING FIBER OPTIC AND CABLE ACCESSIBILITIES

(75) Inventors: Norman Tang, Los Altos, CA (US); Steven A. Hanssen, San Jose, CA (US); Liang Ping Peng, Santa Clara, CA (US)

(73) Assignee: Cisco Technology, Inc., San Jose, CA (US)

( * ) Notice: Subject to any disclaimer, the term of this patent is extended or adjusted under 35 U.S.C. 154(b) by 300 days.

(21) Appl. No.: 13/451,801

(22) Filed: Apr. 20, 2012

(65) Prior Publication Data

US 2013/0279122 A1 Oct. 24, 2013

(51) Int. Cl.
*H05K 7/00* (2006.01)
*H01R 13/633* (2006.01)

(52) U.S. Cl.
CPC .................................. *H01R 13/6335* (2013.01)

(58) Field of Classification Search
USPC ............ 361/728, 807, 809, 810, 825; 439/55, 439/65, 67, 492, 493, 246, 247, 248, 625
See application file for complete search history.

(56) References Cited

U.S. PATENT DOCUMENTS

| | | | | |
|---|---|---|---|---|
| 6,538,882 | B2 * | 3/2003 | Branch et al. | 361/679.02 |
| 6,648,665 | B1 * | 11/2003 | Wu | 439/352 |
| 6,692,159 | B2 | 2/2004 | Chiu et al. | |
| 6,793,517 | B2 | 9/2004 | Neer et al. | |
| 6,840,680 | B1 | 1/2005 | Chiu et al. | |
| 6,885,560 | B2 * | 4/2005 | Zaremba | 361/754 |
| 6,929,403 | B1 | 8/2005 | Arciniegas et al. | |
| 7,052,306 | B2 * | 5/2006 | Ishigami et al. | 439/372 |
| 7,059,887 | B1 | 6/2006 | Liu | |
| 7,066,762 | B2 | 6/2006 | Neer et al. | |
| 7,114,984 | B2 | 10/2006 | Shirk et al. | |
| 7,160,135 | B1 * | 1/2007 | Wu | 439/352 |
| 7,322,845 | B2 * | 1/2008 | Regnier et al. | 439/352 |
| 8,403,695 | B2 * | 3/2013 | Wang et al. | 439/352 |
| 8,545,252 | B2 * | 10/2013 | Wang et al. | 439/352 |
| 8,556,646 | B2 * | 10/2013 | Kappla et al. | 439/352 |
| 2005/0226571 | A1 | 10/2005 | Malagrino, Jr. et al. | |
| 2006/0078259 | A1 | 4/2006 | Fuchs | |

OTHER PUBLICATIONS http://www.molex.com/molex/products/datasheet.jsp?part=active/0747571031_CABLE_ASSEMBLIES.xml.
http://www.finisar.com/products/optical-modules/QSFP/FTL410QE1C.
http://www.cablesondemand.com/category/QSFP%20CBL/product/SF-QSFP2EPASS-002/URvars/Items/Library/InfoManage/.htm.
http://www.te.com/catalog/minf/en/542.

* cited by examiner

*Primary Examiner* — Hung S Bui
(74) *Attorney, Agent, or Firm* — Edell, Shapiro & Finnan, LLC

(57) ABSTRACT

A pluggable module for releasable engagement with a computing device includes a first end portion, a second end portion and a release tab structure. The release tab structure connects with the first end portion to facilitate removal of the module from the port of the computing device and has a generally U-shaped profile including two elongated arms spatially distanced from each other and extending transversely from the first end portion and terminating at a crossbar that connects between the elongated arms. Portions of the elongated arms and the crossbar extend within a plane that is separated a sufficient distance from the cable connector so as to facilitate 360° of access around the cable connector during connection and removal of the cable connector with the cable connection port.

17 Claims, 16 Drawing Sheets

UNIVERSAL PULL TAB RELEASE FOR MODULES INCLUDING FIBER OPTIC AND CABLE ACCESSIBILITIES

TECHNICAL FIELD

The present disclosure relates to release mechanisms for pluggable fiber optic modules and cable assembly modules that are configured to removably attach with computing devices.

BACKGROUND

Pluggable modules, such as fiber optic modules and cable assembly modules, are useful for releasably connecting optical fibers or cables to computing devices (e.g., line cards or other systems). As the next generation of system throughput develops, resulting in increased port density systems to enable increased data transmission rates and reduced structural form factors associated with the systems, the pluggable modules need to be designed to enable the ability to combine multiple modules for removable insertion along the faceplate of a system (e.g., in side-by-side, stacked and/or belly-to-belly configuration) while still allowing ease of access to different types of fiber optic or cable connections to the modules.

A conventional type of release mechanism currently utilized for pluggable modules is a bail latch mechanism. The bail latch mechanism includes a latch that is manipulated by a user to release a locking mechanism for a pluggable module in order to facilitate removal of the module from the port at the faceplate of a computing device. However, the structural design and configuration of the bail latch mechanism limits its use in tight physical spaces, thus limiting its use for high density port configurations in which multiple modules are connected in close proximity to each other along a faceplate of a computing device.

DESCRIPTION OF EXAMPLE EMBODIMENTS

Overview

A pluggable module for releasable engagement with a computing device comprises a first end portion including a cable connection port disposed at an end surface of the first end portion, where the cable connection port is configured to receive and engage with a cable connector. The pluggable module further comprises a second end portion that opposes the first end portion and is configured for insertion within a port of the computing device so as to facilitate transfer of at least one of optical and electrical signals between a cable secured to the cable connector and the computing device, and a release tab structure that connects with the first end portion to facilitate removal of the module from the port of the computing device. The release tab structure has a generally U-shaped profile including two elongated arms spatially distanced from each other and extending transversely from the first end portion and terminating at a crossbar that connects between the elongated arms, where portions of the elongated arms and the crossbar extend within a plane that is separated a sufficient distance from the cable connector so as to facilitate 360° of access around the cable connector during connection and removal of the cable connector with the cable connection port.

Example Embodiments

Figure 1A:
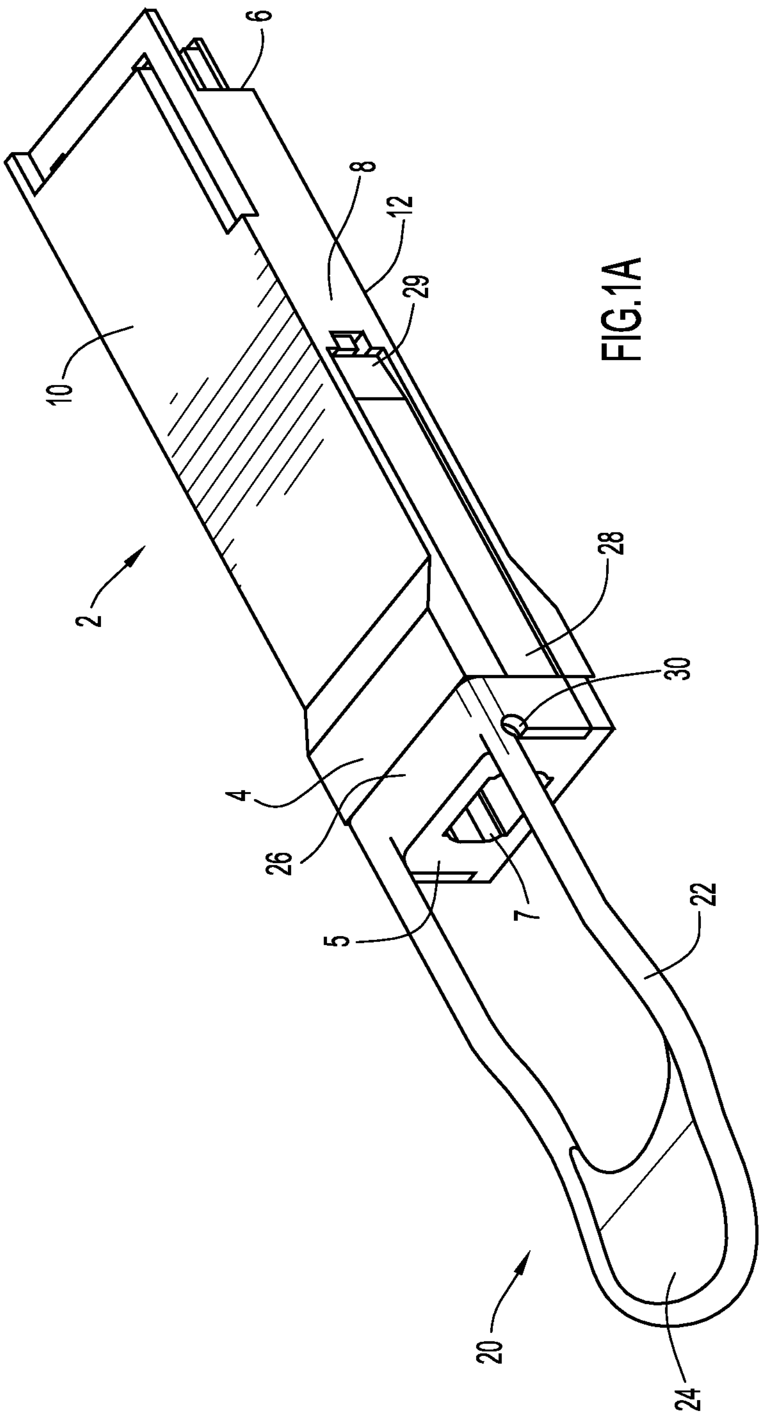
FIGS. 1A-1C depict different views in perspective of a pluggable module including a tab release structure to releasably secure the module into a port of a computing device.
Figure 1B:
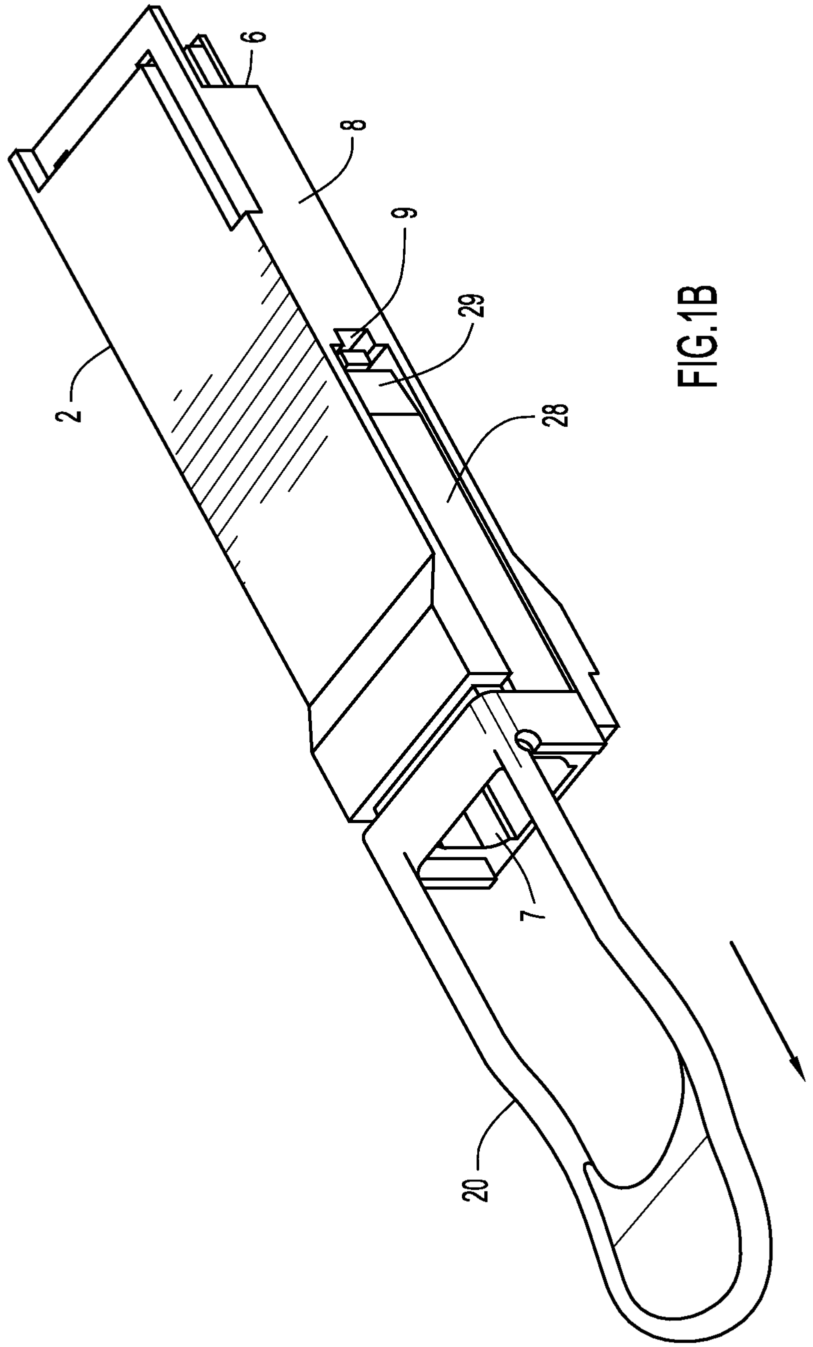
Figure 1C:
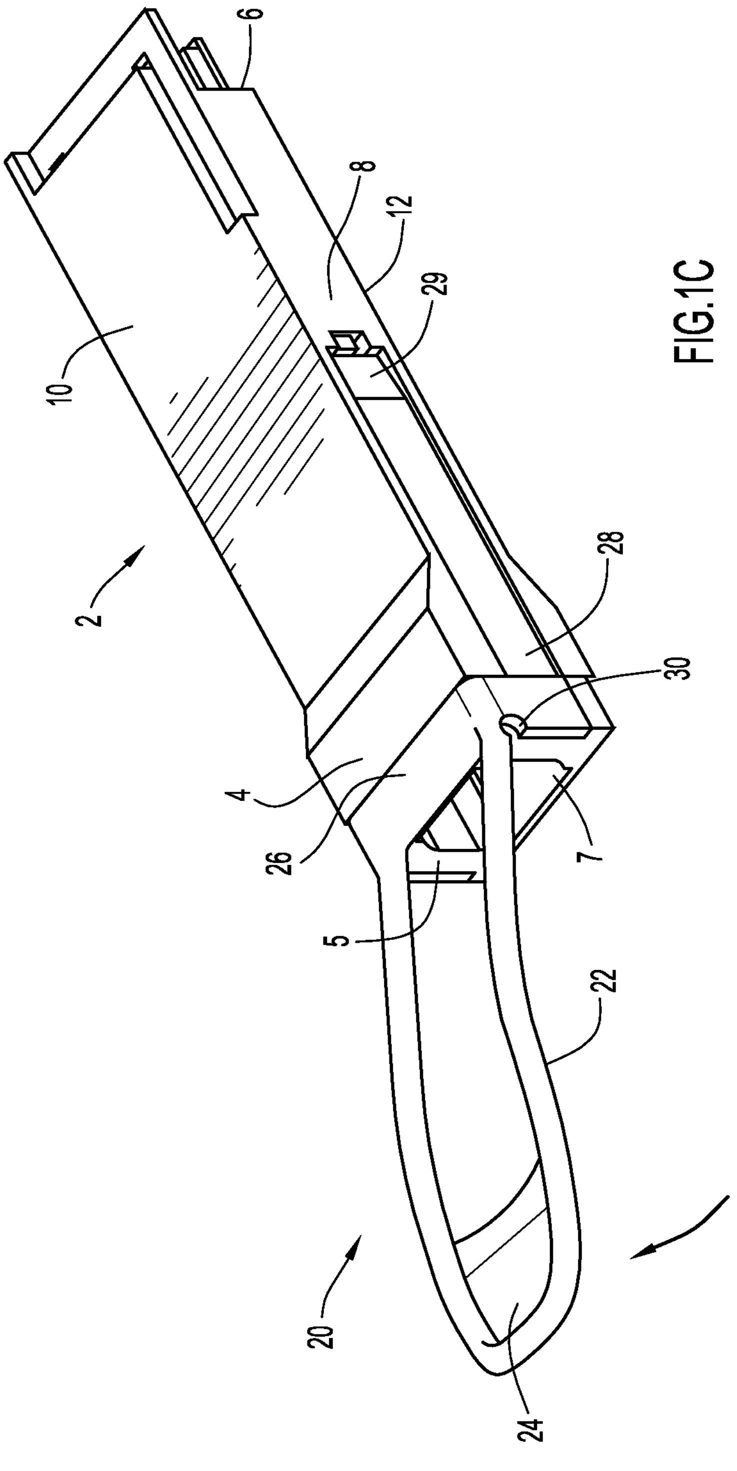

Referring to FIGS. 1A-1C, a pluggable module 2, e.g., a pluggable module of the small form-factor pluggable (SFP) type, has a generally rectangular configuration and includes an outer housing including a first (front) end portion 4 and a second (rear) end portion 6. The first end portion 4 includes an end surface 5 that includes a cable connection port 7. It is noted that the connection port 7 depicted in FIGS. 1A-1C (and also FIG. 6) is configured to fit a cable connector of the MPO type (as described in further detail herein). However, this is depicted for example purposes only, and it is noted that the module end surface 5 can be provided with any one or more cable connection ports that are configured to fit any one or more conventional or other suitable types of fiber optic cable connectors and/or electrical (e.g., copper) cable connectors via a suitable fixed (i.e., non-removable) or releasable connection. The fiber optic/electrical cable connector further connects with a cable configured to transmit and/or receive optical or electrical signals between the cable and internal components of the module 2. Examples of specific types of cables and corresponding cable connectors are further described herein and depicted in FIGS. 2-5. The second end portion 6 of the pluggable module 2 is suitably structured to fit within a port of a computing device (e.g., as described herein and depicted in FIG. 6) so as to facilitate transfer of at least one of optical and electrical signals between a cable secured to the cable connector and the computing device. The housing as well as other components of the module 2 can be constructed of any one or more conventional or other suitable materials that facilitate suitable performance of the modules (e.g., suitable plastic and/or metal materials).

A release tab 20 is connected at the first end portion 4 of the module 2 to facilitate securing of the module within the port of the computing device and also removal of the module 2 from the computing device port. The release tab 20, including all of its components as described herein, can be constructed of any suitable one or more materials that facilitate performance and operation of the release tab in the manner as described herein including, without limitation, plastic materials (e.g., a thermoplastic elastomer such as the types commercially available under the trademark SANTOPRENE, Exxon Mobil Corporation) and metal materials.

The interior components of the pluggable module which facilitate transfer of electrical and/or optical signals between cables connected with the module and the computing device are well known and implemented in a number of commercially available pluggable modules. For example, the pluggable module designs depicted in FIGS. 1-3 and 6 include internal structural components and an outer housing exterior that are similar in configuration to Quad Small Form-Factor Pluggable (QSFP) modules commercially available from Cisco Systems, Inc., while the pluggable module designs depicted in FIGS. 4 and 5 include internal structural components and an outer housing exterior that are similar in configuration to CXP modules commercially available from Cisco Systems, Inc. It is noted that the release tab structure as described herein is universal and is not limited to connecting with the different types of pluggable modules depicted in the figures but instead can be connected with any types of pluggable module including any one or more types of optical and/or electrical connectors.

The release tab 20 has a generally U-shaped profile or configuration and includes two elongated and generally rod-shaped arms 22 extending transversely from the first end portion 4 of the module 2. The elongated arms 22 terminate at a crossbar member 24 that connects the two arms 22. A gap defined between the two arms 22 provides an access space within which a user can extend at least one finger in order to engage with a cable connector connected at the connection port 7 disposed along end surface 5 of the module 2 (e.g., to facilitate securing or removal of the cable connector from the module 2). Each arm 22 includes a slightly curved portion that forms a concave surface on one side and a convex surface on the opposing side and extending in a longitudinal direction of the arm 22 (as can be seen, e.g., in the side views of each of FIGS. 2C, 3C, 4C and 5C). In particular, the curvature of the arms 22 is configured such that each arm 22 initially curves toward and then away from the cable that is attached to the module 2 as the arms 22 extend from the module 2. This curvature provides a contour that allows for easy insertion of a user's thumb or finger underneath the crossbar 24 (i.e., in the space between the crossbar 24 and a cable attached to the module 2) in order to grasp the release tab structure 20 during use. In addition, a peripheral surface of the crossbar 24 at its terminal end is curved and can optionally include a raised lower edge portion (e.g., a slightly curved contour at the lower peripheral edge of the crossbar 24 that faces a cable attached to the module 2) to enhance or improve the user's grip when grasping the crossbar 24 during use.

The crossbar 24 can optionally have a larger surface area dimension on one or more of its sides in relation to the surface area dimensions of the arms 22 (as shown in the figures) so as to provide a gripping surface for a user to grab onto the release tab 20 so as to pull the tab 20 in relation to the module in order to release the securing of the module from the computing device port as described herein.

As depicted in FIGS. 1A-1C, each arm 22 connects to a generally U-shaped connection member 26 disposed over a portion of the module first end portion 4. In particular, the module housing includes opposing side walls 8 and opposing upper wall 10 and lower wall 12 that form the rectangular housing structure of the module 4. It is noted that the terms "upper" and "lower" for the walls 10, 12, as well as "side" for walls 8, are used simply for point of reference in the configuration depicted in FIGS. 1A-1C. It is further noted that the module 2 can be inserted in any orientation within a port of a computing device such that any of the walls 8, 10, 12 can be disposed at an upper orientation and/or lower orientation with respect to the computing device (e.g., as shown for the different orientations of modules, such as belly-to-belly orientations, depicted in FIG. 6). The connection member 26 of the release tab 20 connects (e.g., via a snap fit connection, a molded over connection, or any other suitable connection) to portions of the upper wall 10 and side walls 8 of the module housing. Thus, the arms 22 connect to the connection member 26, which is connected to the module housing, and it is the connection member 26 (not the arms 22) that secures the release tab structure 20 to the module 2.

Two elongated and generally planar locking members 28 extend from the connection member 26, each within a groove or track disposed along a respective side wall 8 of the module housing. Each locking member 28 includes a terminal end 29 with a suitable locking feature that engages in a suitable locking manner within corresponding structure within the port of the computing device when the second end portion 6 of the module 2 is inserted a sufficient distance within the port and when the locking member 28 is fully extended within the corresponding track along side wall 8 (as shown in FIG. 1A). This locking engagement provides a locking connection between the module 2 and the computing device to facilitate use of the module 2 with the computing device while preventing inadvertent removal or disengagement of the module during its interactive operation with the computing device. The release tab 20 is movable in a direction away from the first end portion 4 of the module 2 by pulling the release tab 20 in the direction indicated by the arrow in FIG. 1B. This pulling action results in locking members 28 sliding within the corresponding track and along the respective side wall 8 (with corresponding sliding movement of the connection member 26 along housing surface portions of the first end portion 4 of the module 2), sliding terminal end 29 out of locking engagement with the corresponding locking structure within the port of the computing device (as depicted in FIG. 1B, where the terminal end 29 no longer engages with a corresponding end of the track 9 disposed along side wall 8). When the locking members 28 are moved to the position as depicted in FIG. 1B, the locking connection is disengaged between module 2 and the computing device to allow removal of the module 2 from the computing device port.

The configuration of the release tab 20, including the space or gap between elongated arms 22 and the configuration of the crossbar member 24 with increased gripping surface area, allows the user to grab the crossbar member 24 (e.g., by gripping the crossbar member 24 with the user's thumb and forefinger) and/or insert the user's finger (e.g., forefinger) in the gap between the arms 22 and forming a hook with the user's finger to pull the release tab 20 in the direction indicated by the arrow in FIG. 1B. Further pulling on the release tab 20 by the user in the direction of the arrow indicated in FIG. 1B forces a sliding movement and withdrawal of the module 2 from the port of the computing device.

The elongated arms 22 of the release tab 20 are also flexible to facilitate a bending or flexure of the arms 22 to a selected angle at their connection with the connection member 26 (e.g., a flexure of the arms 22 at an angle as great as 80° or even greater in relation to their connection point with the connection member 26). A reduced material or cut-out section 30 is provided at the connection point between each arm 22 and the connection member 26. This cut-out section 30 provides a "living hinge" at the connection point which facilitates flexure of the arms 22 at one or more selected angles with respect to the connection member 26 as depicted, e.g., in FIG. 1C when a suitable force is applied to the release tab 20. This "living hinge" connection as well as the materials of construction for the release tab 20 further allows for a resilient or "snap back" movement of the arms 22 to their original, unbiased positions (e.g., as depicted in FIGS. 1A and 1B) when the force is removed from the release tab 20. However, it is noted that any other suitable configuration or connection between the release tab and the module can also be provided to facilitate flexure of the release tab as well as its resilient movement back to its original position with respect to the first end portion of the module.

The flexure feature provided for the release tab 20 (e.g., flexing the release tab 20 in the displaced orientation as depicted in FIG. 1C) facilitates easy access to certain types of cable connectors during connection and also removal of the cable connectors from the cable connection port 7 disposed at the end surface 5 of the module housing. For example, certain types of cable connectors require sufficient spacing or distance between any module structure and the connector (e.g., the requirement to have as much as 360° of spacing between the periphery of the cable connector and any module structure) to facilitate finger access by the user to some or all points around the connector.

Prior designs for release mechanisms for pluggable modules (e.g., the conventional bail latch mechanism as well as other related mechanisms used to release the locking between pluggable module and the computing device port) are constructed to attach to the module and include structure disposed around portions of the cable connector that connects with the module thus impeding the ability of a user to access the cable connector at certain locations with the user's fingers, which results in a more difficult attempt at connecting and removing the cable connector with the module. Added to this is the ever increasing port density on computing device faceplates and associated reduction in size or smaller dimensions of small form factor pluggable (SFP) modules, which reduces the space between modules on ports along the faceplate of a computing device and correspondingly reduces access space available for connecting or removing a cable from a pluggable module that is in a linear and/or stacked arrangement with other pluggable modules along the faceplate. The competing space between pluggable modules along the faceplate of the computing device limits the amount of space that can be accommodated for a release mechanism connected with a pluggable module.

In contrast, the release tab described herein is designed to connect with the module and be separated a sufficient distance from the cable connector that connects with the module so as to facilitate 360° of access around the cable connector during connection and removal of the cable connector with the cable connection port. In particular, as depicted in FIGS. 2-6 (which show a cable connector with cable connected to a module), the arms of the release tab are disposed at a suitable or sufficient distance above, below or to the side of (depending upon the orientation of the module) the cable connector and cable so as to permit at least 180° of free space around the cable connector in which no portion of the release tab surrounds any portion of the cable connector. This is because at least the elongated arms and crossbar of the release tab extend generally within a plane that is separated a suitable or sufficient distance from one side portion of the cable connector and cable when the cable connector is connected with the cable connection port of the module. For example, as depicted in FIGS. 2A-2C (with similar configurations between the release tab and cable connector with cable shown in FIGS. 3-5), the release tab 20 including arms 22 and crossbar member 24 extends generally within a plane that is located a sufficient distance above any portion of the cable connector 40 and cable 42 which are connected with the module 2.

The pluggable modules with release tab structures as described herein can be configured for connection with any suitable types of computing devices (e.g., line cards for networking systems, communications systems or any other types of computing systems). In addition, the pluggable modules with release tab structures as described herein can be configured for use with fiber optic or electrical cables of any suitable types including, without limitation, optical fiber cable connectors such as LC connectors, MPO (multiple fiber push-on pull-off) connectors, etc., and electrical cable connectors such as copper wire cable connectors, modular plug connectors (e.g., Ethernet connectors), etc. Each of these types of cable connectors can have a different connection structure that connects within a corresponding cable connection port of the module that is well known and has a standardized or other suitable connecting configuration. For example, an LC optical fiber cable connector includes a pivot connection tab that locks the LC connector into its corresponding connection port and which requires the pivot tab to be depressed to disengage the LC connector from its connection port. An MPO connector has a connecting structure that typically requires finger access around a major or substantial portion of the connector periphery in order to secure and remove the MPO connector from its corresponding connection port. Other types of cable connectors may require access along different peripheral portions of the cable connector in order to facilitate attachment and removal.

The design and configuration of the release tab structure described herein and in relation to the embodiments depicted in the figures provides minimal surrounding structure and thus minimal intrusion upon the space surround the cable connector that attaches with the pluggable module so as to easily accommodate different types of cable connectors as well as different types of pluggable modules.

Figure 2A:
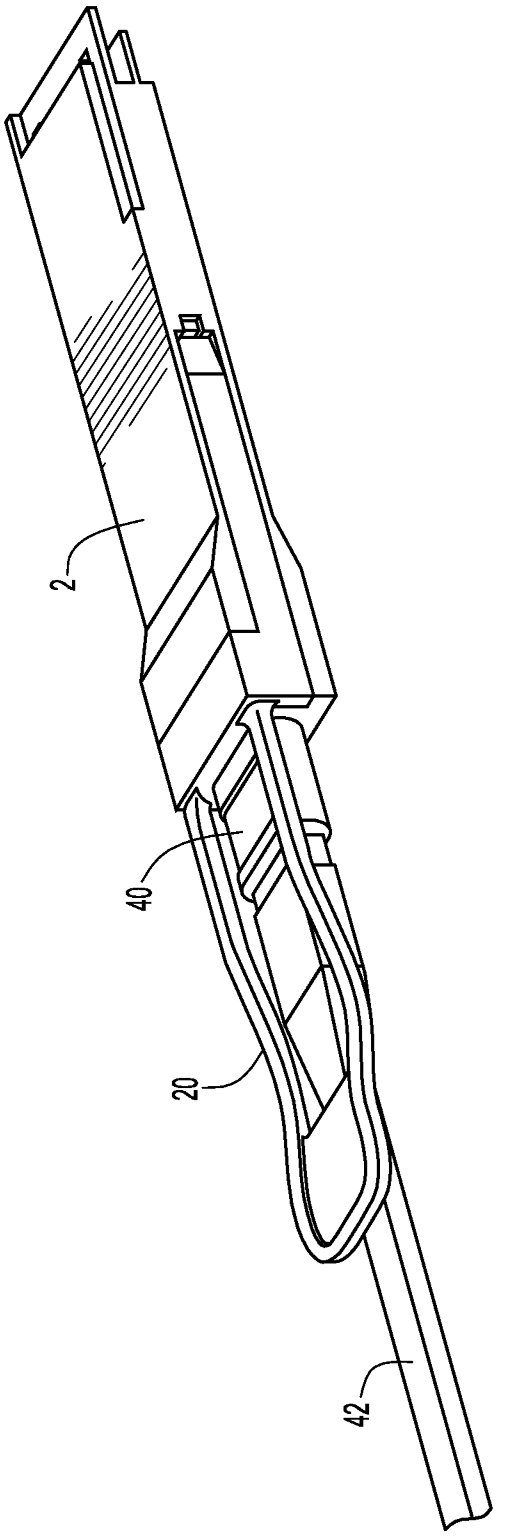
FIG. 2A is a view in perspective of the module with tab release structure of FIG. 1A including a multiple fiber push-on pull-off (MPO) connector secured to the module.
Figure 2B:
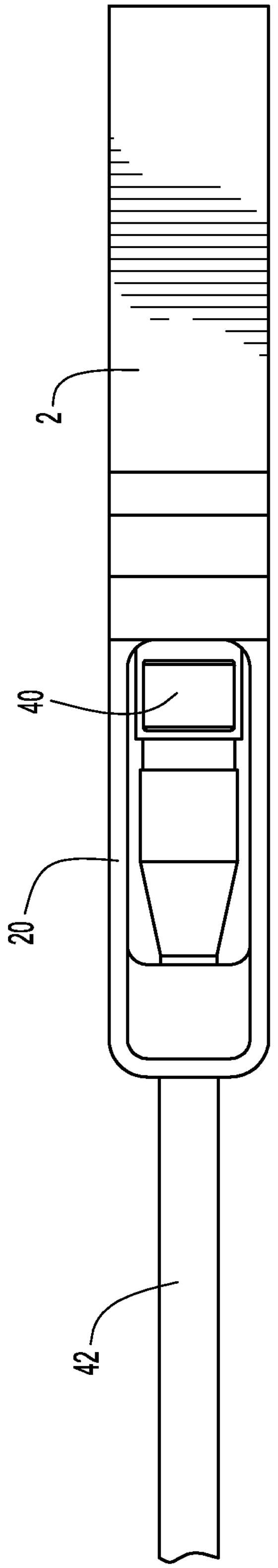
FIG. 2B is a top view in plan of the module with tab release structure and with MPO connector of FIG. 2A.
Figure 2C:
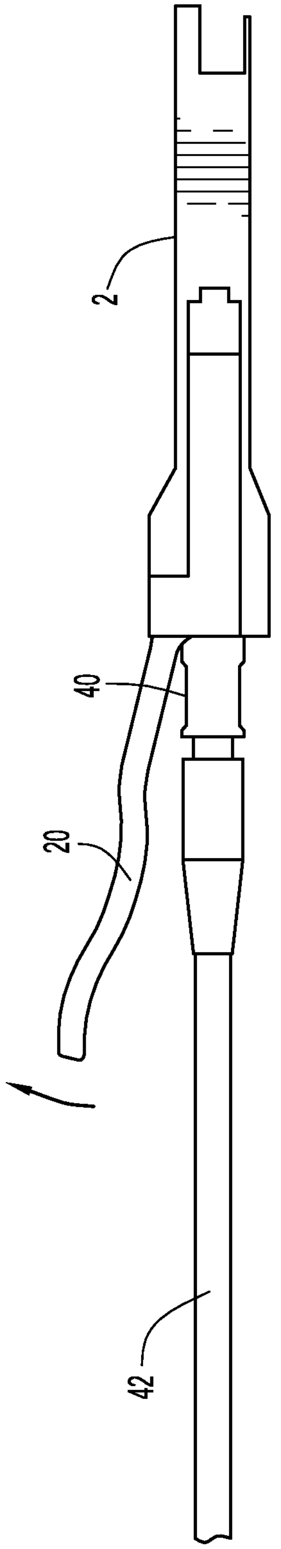
FIG. 2C is a side view in elevation of the module with tab release structure and with MPO connector of FIG. 2A.

Referring to FIGS. 2A-2C, the module 2 is designed with a suitable MPO connection port 7 disposed on the end surface 5 at the first end portion 4 of the module 2 and suitable internal components to connect with an MPO connector 40 with corresponding fiber optic cable 42. The release tab 20 generally extends within a plane that is located a suitable or sufficient distance to one side of the connector 40 and cable 42 (e.g., above, below, or to a side of the connector and cable, depending upon the orientation of the module 2) and no portion of the release tab 20 is located along any other side or lower portions of the connector 40 which might otherwise impede finger access to peripheral side portions of the connector 40. In addition, as shown in FIG. 2C, the release tab 20 can be flexed at an angle upward by as much as 80° or greater (as shown by the arrow in FIG. 2C) to further increase the distance between the arms 22 and crossbar 24 from the connector 40 and cable 42 in order to provide additional finger space as needed when connecting or removing the connector 40 from the module cable connection port 7.

Figure 3A:
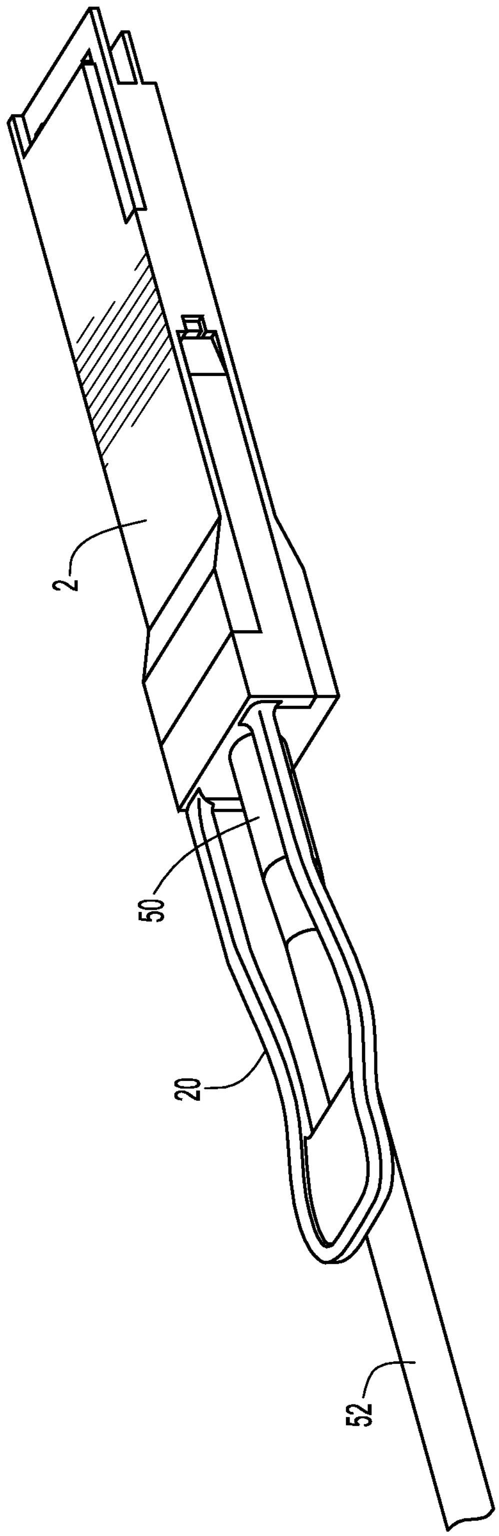
FIG. 3A is a view in perspective of the module with tab release structure of FIG. 1A including an electrical wire cable connector secured to the module.
Figure 3B:
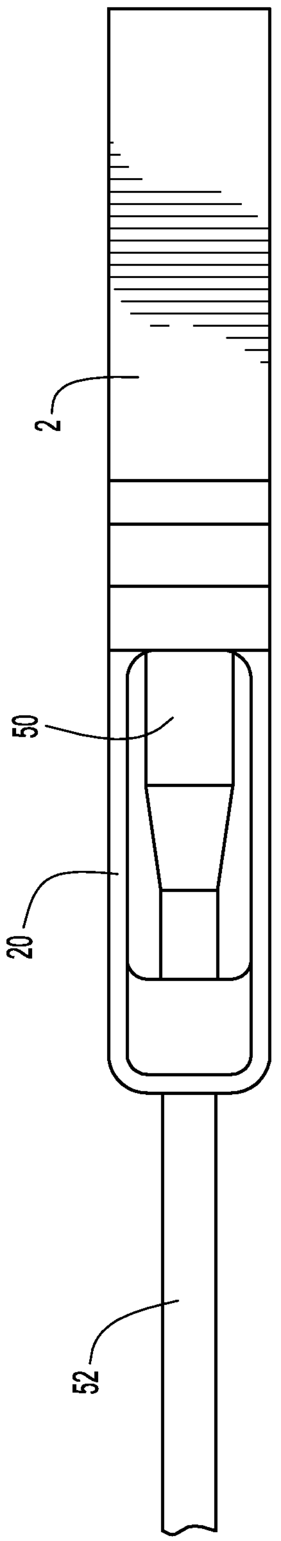
FIG. 3B is a top view in plan of the module with tab release structure and with electrical wire cable connector of FIG. 3A.
Figure 3C:
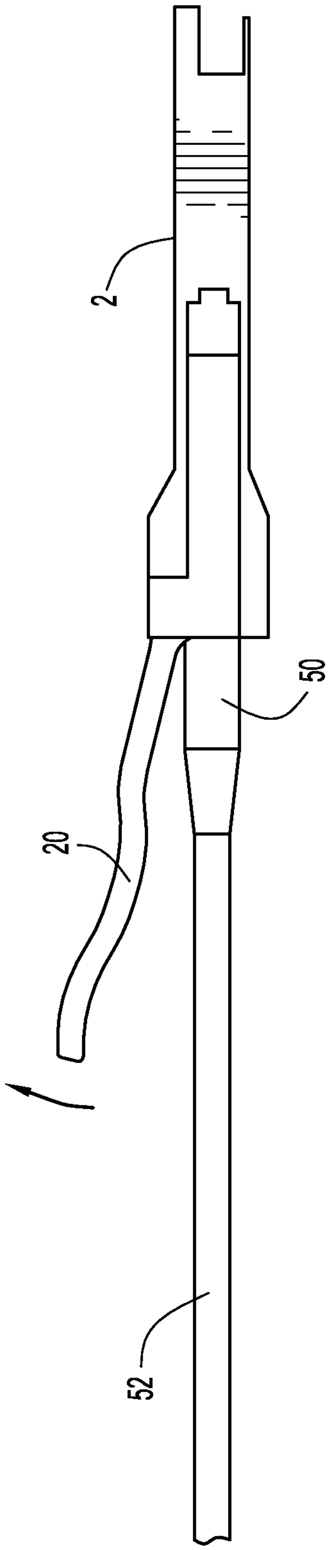
FIG. 3C is a side view in elevation of the module with tab release structure and with electrical wire cable connector of FIG. 3A.

Referring to FIGS. 3A-3C, the module 2 is designed with a directly attached or affixed cable connection port disposed on the end surface 5 at the first end portion 4 of the module 2 and suitable internal components to connect with an electrical cable connector 50 and corresponding cable 52. While the configuration of the release tab 20 with respect to the connector 50 and cable 52 is the same or similar to that which is described in relation to the embodiment depicted in FIGS. 2A-2C, it is noted that flexure or raising of portions of the release tab may not be needed, since the copper cable is permanently attached to the module and cannot be removed. Thus, the release tab in the embodiment of FIGS. 3A-3C is used for the removal of the module only. However, it is noted that the release tab structural features provide a universal design or configuration that can be used with multiple types of different cable connectors and modules. Thus, even though the flexure feature for the release tab may not be needed for this copper cable connector embodiment, the same general release tab configuration can still be provided and effectively used without the need for significant modification of the release tab design.

Figure 4A:
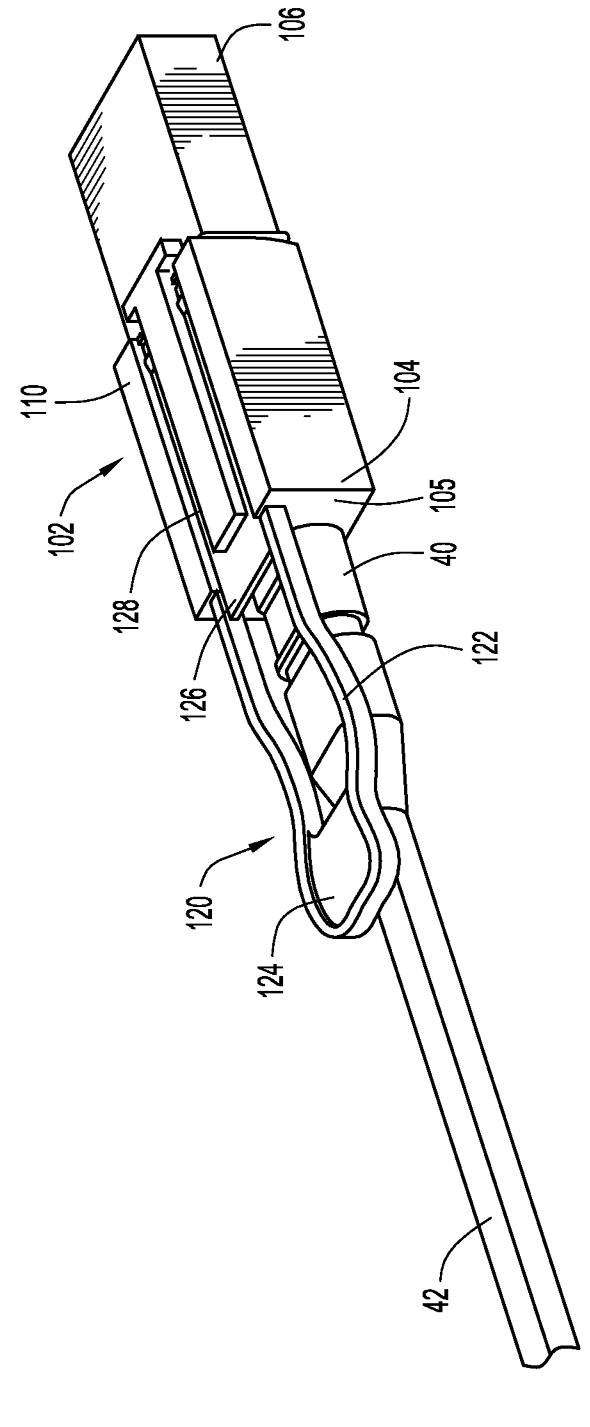
FIG. 4A is a view in perspective of another pluggable module with a tab release structure and including a MPO connector secured to the module.
Figure 4B:
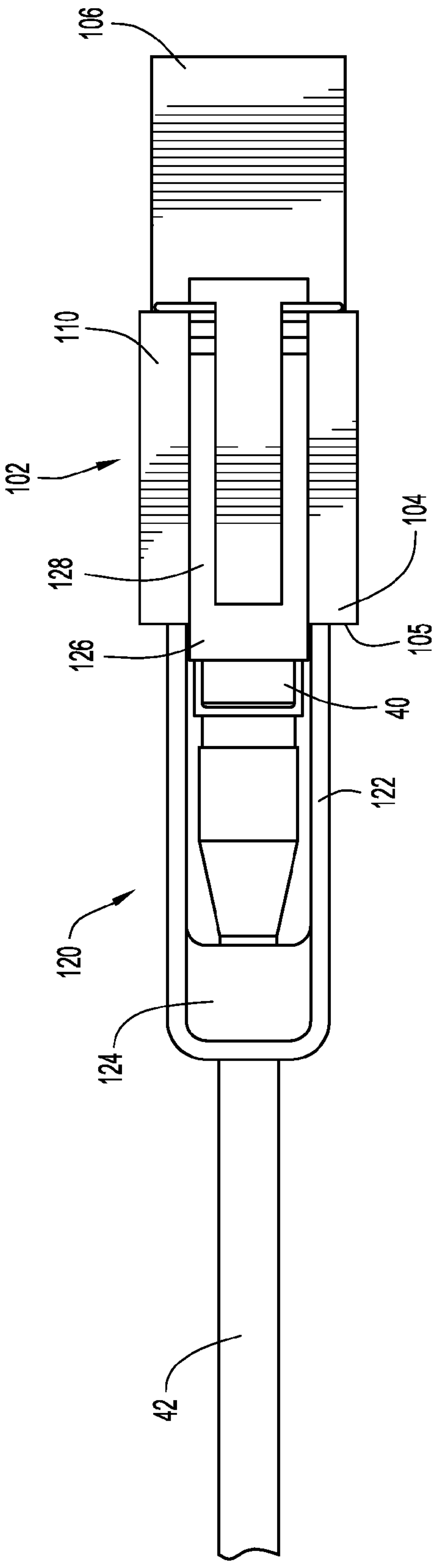
FIG. 4B is a view in perspective of the module with tab release structure and with MPO connector of FIG. 4A.
Figure 4C:
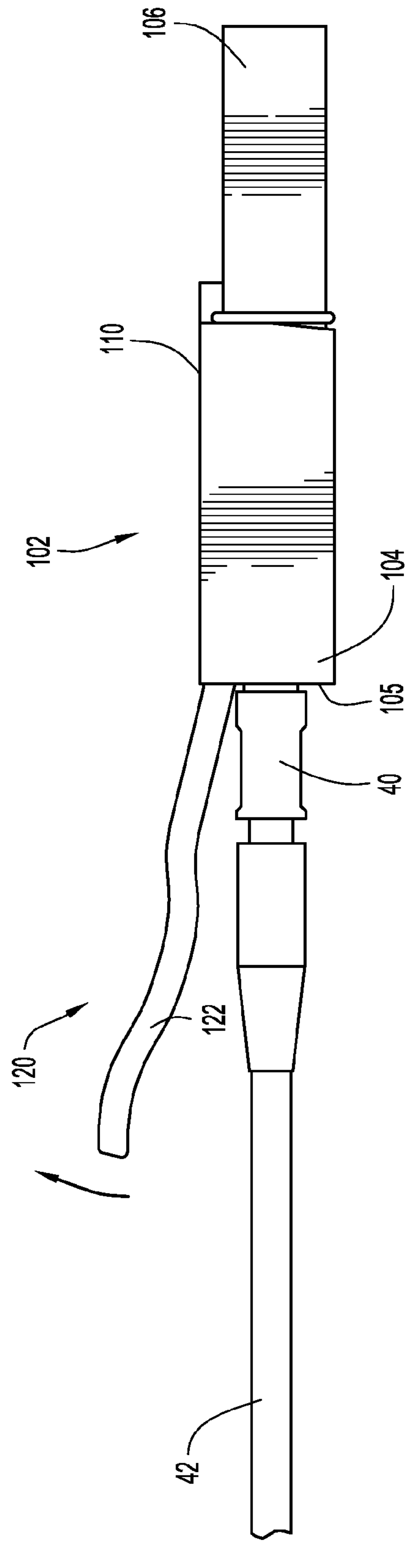
FIG. 4C is a side view in elevation of the module with tab release structure and with MPO connector of FIG. 4A.
Figure 5A:
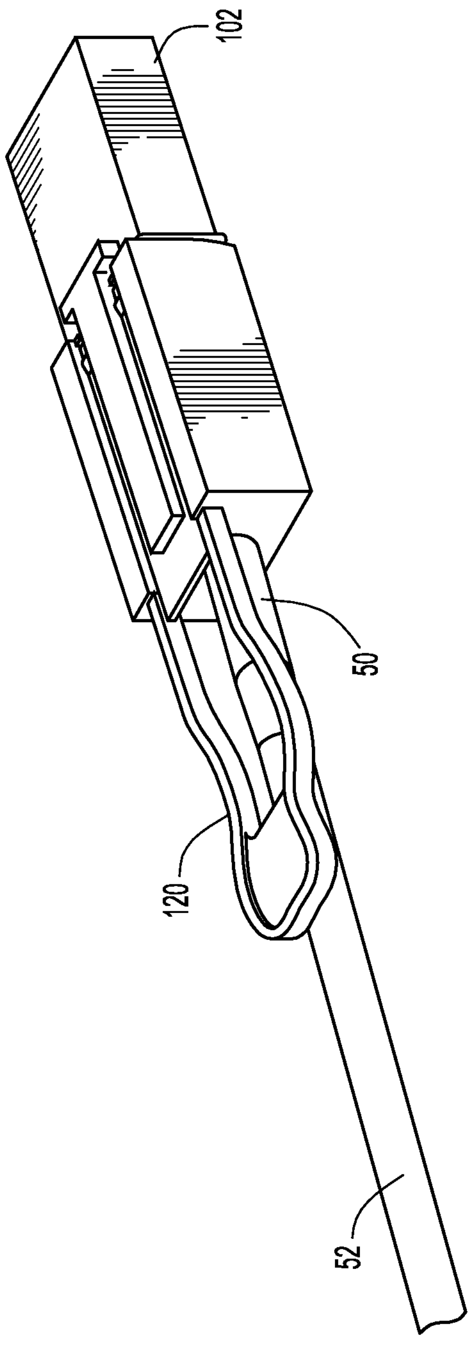
FIG. 5A is a view in perspective of a pluggable module with tab release structure similar to that shown in FIG. 4A but with an electrical wire cable connector secured to the module.
Figure 5B:
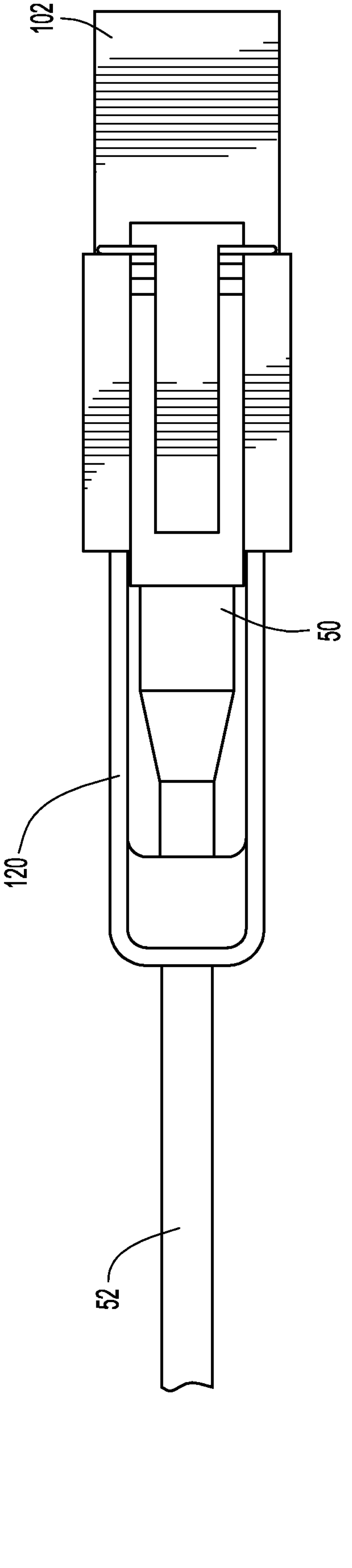
FIG. 5B is a top view in plan of the module with tab release structure and electrical wire cable connector of FIG. 5A.
Figure 5C:
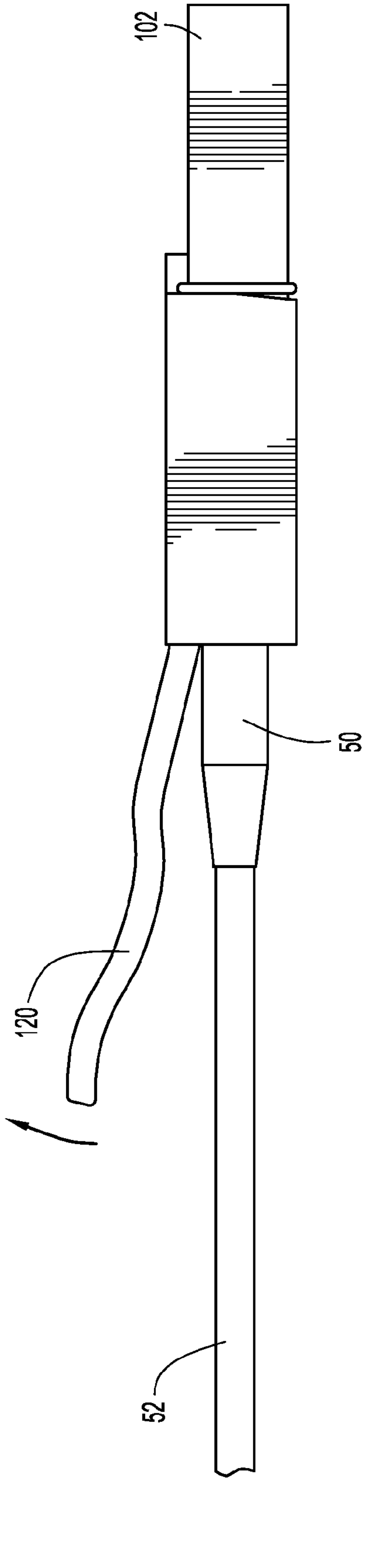
FIG. 5C is a side view in elevation of the module with tab release structure and electrical wire cable connector of FIG. 5A.

The modules depicted in each of FIGS. 4A-4C and FIGS. 5A-5C provide further examples of modules in which the release tab can be used, where the modules are slightly different in configuration from those depicted in the previous FIGS. 1-3. In particular, the pluggable module 102 has a generally rectangular housing including a first (front) end portion 104 with an end surface 105 that includes a cable connection port to receive either an MPO connector 40 (as depicted in FIGS. 4A-4C) or an electrical cable connector 50 (as depicted in FIGS. 5A-5C). The release tab 120 includes elongated arms 122 and a crossbar member 124 having similar configurations as described above for the release tab 20 of FIGS. 1-3, with the exception that each arm 122 connects with a generally planar connection member 126 disposed along an upper surface 110 of the housing (or a lower surface, depending upon the orientation of the module 102).

The connection member 126 includes two generally planar and elongated locking members 128 that extend from the connection member 126 along grooves or tracks disposed along the upper surface 110 of the module housing. The release tab 120 operates in a manner similar to that which was previously described in relation to release tab 20, where pulling of the release tab 120 in a direction away from the first end portion 104 of the module 102 forces a corresponding sliding movement of the locking members 128 away from terminal end portions of the tracks within which they are disposed so as to release a locking connection between the locking members 128 and corresponding locking structure within a port of a computing device that the end portion 106 of the module 102 is inserted (thus permitting removal of the module 102 from the computing device port).

Despite the differences in the configuration of the modules and corresponding release tab structures shown in FIGS. 1-3 and FIGS. 4-5, the orientation of the release tab with respect to a cable connector secured to the first end cable connection port of the module is the same or substantially similar, thus providing easy access to the cable connector with very little opposition or resistance from the release tab. As shown in FIG. 4C, the release tab 120 can also be flexed or pivoted in a direction away from the cable connector 40 so as to provide further distance between arms 122 and the cable connector 40 during installation or removal of the cable connector with the module 102. The design and materials of construction of the arms 122 permits their flexure at a suitable angle in relation to their connection points with the connection member 124 upon application of a suitable force by the user to the release tab 120 while facilitating a resilient or "snap back" movement of the arms 122 back to their original, unbiased positions (e.g., as depicted in FIGS. 4A and 4B) when the force is removed from the release tab 120. Thus, the release tab structure is effective universally for a number of different module as well as cable connector configurations.

Figure 6:
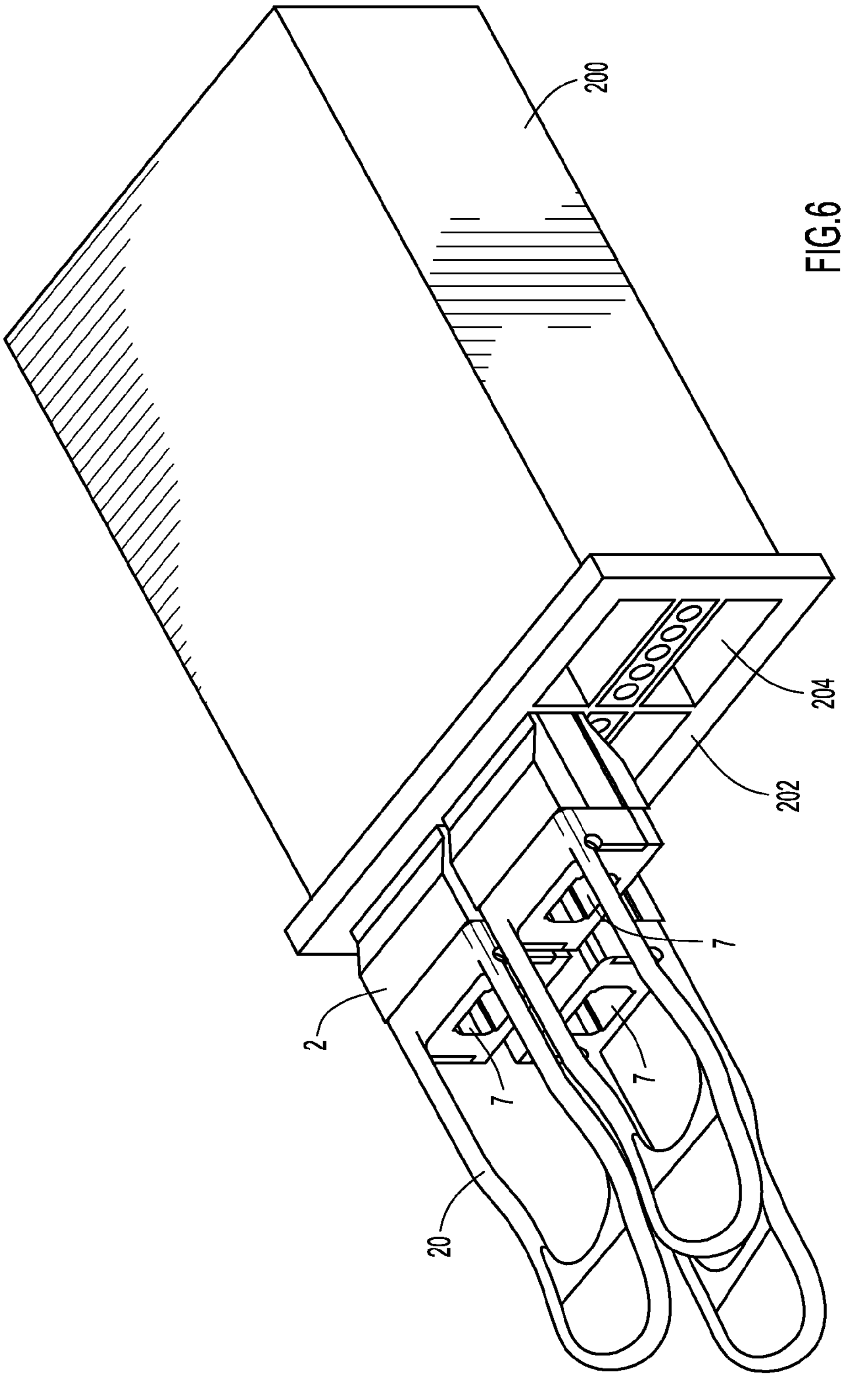
FIG. 6 is a view in perspective of a portion of a computing device including a face plate with ports configured to receive a plurality of pluggable modules with release tab structures similar to that shown in FIG. 1A, where the modules are releasably secured within the ports of the computing device in different configurations.

An example embodiment of FIG. 6 depicts a connection of a plurality of modules of the types depicted in FIGS. 1A-1C with a faceplate 202 of a portion of a computing device 200. While only a portion of the computing device 200 is depicted in FIG. 6, it is to be understood that the computing device can be any suitable type of computing device, such as the example types previously described, and including other suitable components (e.g., a processor, memory, network interfacing hardware and/or any other suitable hardware components as well as any suitable peripheral devices, other connection ports for connection with other devices, etc.) as may be needed for particular system requirements. The faceplate 202 of the computing device 200 can be located at any one or more suitable locations along housing side, front and/or rear walls of the device. The faceplate 202 includes a plurality of ports 204 configured to receive pluggable modules of the same and/or different types. The ports 204 are further configured such that the modules can be connected in all sorts of configurations with respect to each other along the faceplate 202, including side by side (e.g., 1×N), stacked (e.g., 2×N, 3×N, etc.) and belly-to-belly where a first module is oriented in a rotated or upside down configuration with respect to a second module disposed immediately above the first module (i.e., the lower wall 12 of a first module 2 faces the lower wall 12 of a second module 2 disposed immediately above the first module 2 as shown in FIG. 6). Thus, for a belly-to-belly configuration, each port 204 aligned vertically with respect to another port is rotationally oriented on the faceplate 202 about 180° in relation to the other port so as to facilitate the receipt and interaction with a module 2 inserted within such port. The belly-to-belly configuration allows the furthest separation between release tabs 20 that are stacked upon each other, which in turn facilitates pivotal movement or flexure of each release tab for a module to its greatest extent without contacting the release tab for the other, stacked module.

Operation of a computing device utilizing one or more pluggable modules with universal release tabs is now described with reference to FIGS. 1A-1C and also FIG. 6. The second (rear) end portion 6 of a module 2 is inserted within a port 204 disposed on the faceplate 202 of a computing device 200. Insertion of the module 2 can be assisted, e.g., utilizing the release tab structure 20 (e.g., by pushing upon the crossbar member 24 and/or the arms 22 to force the module 2 a sufficient distance within the port 204). When the module 2 is inserted a sufficient distance within the port 204 of the computing device 200, the module end portion 6 connects with suitable structure within the port 204 to facilitate transfer of optical and/or electrical signals between the module 2 (e.g., via a cable connected with the module 2) and corresponding components of the computing device 200. Sufficient insertion of the module end portion 6 into the port 204 further achieves a suitable locking connection between locking member terminal ends 29 and corresponding structure within the port 204 of the computing device 200. If a cable needs to be connected with the cable connection port at the end surface 5 of the module 2 (e.g., when the cable is configured for removable connection with the module, such as an MPO cable 40 as depicted in FIGS. 2A-2C), the cable is connected with optional pivoting flexure of the arms 22 away from the cable connection port by the user (e.g., as shown in FIG. 2C) as may be needed to facilitate access to the cable connector for connecting with the connection port of the module 2. Upon connection in this manner, optical and/or electrical signals can be transferred between the computing device 200 and a cable (e.g., cables 42 and 52 as shown in FIGS. 2 and 3) via the module 2.

If it is desired to remove a cable from the module 2 (for configurations which permit such removal), the cable (e.g., cable 42) can be easily removed from the module 2 while the module 2 is still mounted or connected within the port 204 of the computing device 200. Alternatively, it may be desired to remove the entire module 2 with cable attached thereto from the port 204. In this scenario, the release tab arms 22 and crossbar member 24 are pulled in a direction away from the faceplate 202 of the computing device 200 (e.g., in a manner as shown in FIG. 1B) so as to slide the locking members 28 and their terminal ends 29 out of position with the corresponding locking structure within the computing device port 204. Further pulling upon the release tab structure 20 facilitates removal of the module 2 from the port 204.

Thus, the pluggable modules with release tabs facilitate easy access to cable connectors connected with the modules during connection/installation and removal of the cable connectors with respect to the modules. This is particularly important in embodiments, such as they type depicted in FIG. 6, in which multiple pluggable modules (e.g., SFP modules) are connected in a series of closely spaced ports within the faceplate of a computing device.

The above description is intended by way of example only.

What is claimed is:

1. A pluggable module for releasable engagement with a computing device, the module comprising:

a first end portion including a cable connection port disposed at an end surface of the first end portion, the cable connection port being configured to receive and engage with a cable connector;

a second end portion that opposes the first end portion and is configured for insertion within a port of the computing device so as to facilitate transfer of at least one of optical and electrical signals between a cable secured to the cable connector and the computing device;

a release tab structure that connects with the first end portion to facilitate removal of the module from the port of the computing device, the release tab structure having a generally U-shaped profile including two elongated arms spatially distanced from each other and extending transversely from the first end portion and terminating at a crossbar that connects between the elongated arms, wherein portions of the elongated arms and the crossbar extend within a plane that is separated a sufficient distance from the cable connector so as to facilitate 360° of access around the cable connector during connection and removal of the cable connector with the cable connection port; and a connection member that connects the elongated arms to the first end portion of the module, wherein the elongated arms are pivotally movable in relation to the connection member to facilitate a further separation in distance between the elongated arms and the cable connector.

2. The pluggable module of claim 1, wherein the elongated arms and the crossbar are located the sufficient distance from one side of the cable connector with no portion of the elongated arms and crossbar being located along any other sides of the cable connector that might otherwise impede finger access to peripheral side portions of the connector cable connector.

3. The pluggable module of claim 1, wherein:

the connection member includes a locking structure that provides a locking connection with a corresponding locking structure disposed within the port of the computing device; and the elongated arms, crossbar and connection member are slidable in a direction away from the end surface of the first end portion of the module to facilitate a release of the locking connection and removal of the module from the port of the computing device.

4. The pluggable module of claim 3, wherein the connection member includes at least one elongated locking member that slides within a track disposed on an exterior surface of the module.

5. The pluggable module of claim 1, wherein each elongated arm has a curved configuration that forms a concave surface on one side and a convex surface on an opposing side along a longitudinal direction of the arm.

6. The pluggable module of claim 1, wherein the module is configured to connect with at least one of an LC fiber optic cable connector and an MPO fiber optic cable connector.

7. An apparatus comprising:

a computing device including a faceplate with a plurality of ports configured to receive one or more different types of pluggable modules; and a pluggable module configured for releasable engagement within at least one port disposed along the faceplate so as to facilitate transfer of at least one of optical and electrical signals between a cable secured to the pluggable module and the computing device, the module comprising:

a first end portion including a cable connection port disposed at an end surface of the first end portion, the cable connection port being configured to receive and engage with a cable connector;

a second end portion that opposes the first end portion and is configured for insertion within the at least one port disposed along the faceplate;

a release tab structure that connects with the first end portion to facilitate removal of the module from a port of the faceplate within which the second end portion of the module is inserted, the release tab structure having a generally U-shaped profile including two elongated arms spatially distanced from each other and extending transversely from the first end portion and terminating at a crossbar that connects between the elongated arms, wherein portions of the elongated arms and the crossbar extend within a plane that is separated a sufficient distance from the cable connector so as to facilitate 360° of access around the cable connector during connection and removal of the cable connector with the cable connection port; and a connection member that connects the elongated arms to the first end portion of the module, wherein the elongated arms are pivotally movable in relation to the connection member to facilitate a further separation in distance between the elongated arms and the cable connector.

8. The apparatus of claim 7, further comprising a plurality of pluggable modules connected within corresponding ports along the faceplate of the computing device, wherein first and second modules are vertically aligned in relation to each other with the second module being rotationally oriented 180° in relation to the first module such that a release tab structure is connected at a side of the first module that faces away from the second module and a release tab structure is connected at a side of the second module that faces away from the first module.

9. The apparatus of claim 7, wherein the elongated arms and the crossbar are located the sufficient distance from one side of the cable connector with no portion of the elongated arms and crossbar being located along any other sides of the cable connector that might otherwise impede finger access to peripheral side portions of the connector cable connector.

10. The apparatus of claim 7, wherein:

the connection member includes a locking structure that provides a locking connection with a corresponding locking structure disposed within the port of the computing device; and the elongated arms, crossbar and connection member are slidable in a direction away from the end surface of the first end portion of the module to facilitate a release of the locking connection and removal of the module from the port of the computing device.

11. The apparatus of claim 7, wherein the at least one pluggable module is configured to connect with one of an LC fiber optic cable connector and an MPO fiber optic cable connector.

12. A method comprising:

providing a pluggable module including a first end portion with a cable connection port disposed at an end surface of the first end portion, the cable connection port being configured to receive and engage with a cable connector, a second end portion that opposes the first end portion, and a release tab structure that connects with the first end portion, the release tab structure having a generally U-shaped profile including two elongated arms spatially distanced from each other and extending transversely from the first end portion and terminating at a crossbar that connects between the elongated arms, wherein portions of the elongated arms and the crossbar extend within a plane that is separated a sufficient distance from the cable connector so as to facilitate 3600 of access around a cable connector connected with the connection port;

inserting the second end portion of the module within a port disposed along a faceplate of a computing device so as to facilitate transfer of at least one of optical and electrical signals between the cable secured to the cable connector of the module and the computing device; and pivotally moving the elongated arms in relation to a connection member that connects the elongated arms with the first end portion of the module so as to facilitate a further separation in distance between the elongated arms and the cable connector.

13. The method of claim 12, further comprising:

inserting a second module within a port of the faceplate of the computing device that is vertically aligned with the port in which the second end portion of the module is inserted;

wherein the module and the second module are vertically aligned in relation to each other with the second module being rotationally oriented 180° in relation to the module such that a release tab structure is connected at a side of the module that faces away from the second module and a release tab structure is connected at a side of the second module that faces away from the module.

14. The method of claim 12, further comprising:

connecting a cable connector including a cable to the cable connection port of the module.

15. The method of claim 14, wherein the connecting the cable connector to the cable connection port of the module further comprises:

connecting one of an LC fiber optic cable connector and an MPO fiber optic cable connector to the cable connection port.

16. The method of claim 12, further comprising:

pulling upon the release tab structure to slide the elongated arms, crossbar and the connection member that connects the elongated arms with the first end portion of the module in a direction away from the end surface of the first end portion so as to facilitate a release of a locking connection between a locking structure of the connection member and a corresponding locking structure disposed within the port of the computing device.

17. The method of claim 16, further comprising:

further pulling the release tab structure in a direction away from the faceplate of the computing device to facilitate removal of the module from the port.

* * * * *

UNITED STATES PATENT AND TRADEMARK OFFICE

CERTIFICATE OF CORRECTION

PATENT NO. : 9,001,515 B2
APPLICATION NO. : 13/451801
DATED : April 7, 2015
INVENTOR(S) : Norman Tang et al.

It is certified that error appears in the above-identified patent and that said Letters Patent is hereby corrected as shown below:

In the Claims

Column 11, Line 39, change “3600” to --360°--

Signed and Sealed this
Fifth Day of April, 2016

Michelle K. Lee
*Director of the United States Patent and Trademark Office*